United States Patent [19]

Haga et al.

[11] Patent Number: 4,804,410
[45] Date of Patent: Feb. 14, 1989

[54] PALLADIUM-BASE ELECTROLESS PLATING SOLUTION

[75] Inventors: Masaki Haga; Kiyotaka Tsuji, both of Kobe; Hidemi Nawafune, Takatsuki; Shozo Mizumoto, Kobe; Ei Uchida, Amagasaki, all of Japan

[73] Assignee: Ishihara Chemical Co., Ltd., Kobe, Japan

[21] Appl. No.: 128,111

[22] PCT Filed: Feb. 21, 1987

[86] PCT No.: PCT/JP87/00113
§ 371 Date: Oct. 21, 1987
§ 102(e) Date: Oct. 21, 1987

[87] PCT Pub. No.: WO87/05338
PCT Pub. Date: Sep. 11, 1987

[30] Foreign Application Priority Data

Mar. 4, 1986 [JP] Japan .................. 61-46727
Aug. 21, 1986 [JP] Japan .................. 61-196282

[51] Int. Cl.[4] .................. C09D 5/38; C09D 5/00; B22F 7/00
[52] U.S. Cl. .................. 106/1.15; 106/1.23; 106/1.28; 427/304
[58] Field of Search .................. 106/1.15, 1.23, 1.28; 427/304

[56] References Cited

U.S. PATENT DOCUMENTS 3,418,143 12/1968 Sergienko .................. 106/1.28
3,515,563 6/1970 Hodoley et al. .................. 106/1.23

FOREIGN PATENT DOCUMENTS 2153692 4/1973 Fed. Rep. of Germany ..... 106/1.28
36-09062 6/1961 Japan .
38-2113 9/1961 Japan .................. 106/1.24
46-26764 8/1971 Japan .
53-37045 10/1978 Japan .

OTHER PUBLICATIONS

Pearlstein et al., Electrochemical Technology, 6, pp. 427–430 (1968).
Manual of Metal Finishing Techniques, edited by The Metal Finishing Society of Japan, pp. 444–447, published Nov. 30, 1976.

Primary Examiner—Theodore Morris
Attorney, Agent, or Firm—Armstrong, Nikaido, Marmelstein & Kubovcik

[57] ABSTRACT

The present invention provides a palladium-base electroless plating solution which is excellent in stability and which is capable of forming a satisfactory palladium-base deposit, the solution being an aqueous solution containing (a) a palladium compound, (b) at least one compound of ammonia and amine compounds, (c) an organic compound containing bivalent sulfur, and (d) at least one compound of hypophosphorous acid compounds and boron hydride compounds, and a palladium-base electroless plating solution containing a nickel compound in addition to said electroless plating solution.

14 Claims, 3 Drawing Sheets

PALLADIUM-BASE ELECTROLESS PLATING SOLUTION

TECHNICAL FIELD

The present invention relates to a palladium-base electroless plating solution.

BACKGROUND ART

It is required to coat the surface of electric contact portions of electronic parts with a noble metal having a high corrosion resistance and outstanding electrical characteristics. At present, while gold electrodeposition is chiefly adopted to coat the surface of electric contact portions, electrodeposition methods encounter difficulties in forming deposits of uniform thickness on electronic parts of finely elaborate and complicated shape.

On the other hand, electroless plating methods can deposit a coating of uniform thickness even on electronic parts of finely elaborate and intricate shape. Consequently it is desired to develop methods for treating the surface of such parts with noble metals by electroless plating. Of platinum group metals, palladium is the most inexpensive and is expected to find extensive industrial applications.

A typical electroless palladium plating solution heretofore known is an aqueous solution containing a bivalent palladium salt as a metal source, ammonia as a complexing agent, ethylenediaminetetraacetic acid or a salt thereof as a stabilizing agent and hydrazine as a reducing agent.

This plating solution, however, has the serious drawback of being unpreservable because of its poor stability and susceptibility to spontaneous decomposition. Further said plating solution has the defect of being quickly decomposable due to the Pd delivered from a pretreating solution. Such plating solution containing hydrazine as a reducing agent suffers the additional shortcoming that when a substrate has been immersed in the plating solution for a longer period of time, the depression rate is pronouncedly reduced although only small amounts of effective components in the plating solution have been consumed. Moreover, the plating solution poses the problem of requiring ammonia in a high concentration as a complexing agent because of the low stability of the plating solution, hence undesirable in terms of work environment.

Also known is an electroless palladium plating solution comprising a bivalent palladium salt, ethylenediaminetetraacetate, ethylenediamine and sodium hypophosphite (Japanese Examined Patent Publication No. 26764/1971). Yet this plating solution is defective in having a low stability and decomposing in a short period of time.

None of the plating solutions described above can be applied to electronic parts because they deposit a coating having numerous cracks and being poor in solderability. These plating solutions entail further drawbacks such that in deposition of thick coating, the deposition rate is noticeably decreased with the increase of thickness of coating being deposited, resulting in coating which is blackened and thus impaired in appearance.

Accordingly the electroless palladium plating solutions heretofore reported can be said to remain on a laboratory scale presently.

Pd-Ni alloy coatings obtained by alloying nickel with palladium are known to be unlikely even in an atmosphere of organic gas to have an undesired effect attributable to the presence of organic gas such as the contact failure in an electric contact portion caused by the polymerization of organic gas. While it is consequently desired to put Pd-Ni alloy plating to practical use, few reports have been made on electroless Pd-Ni alloy plating solutions usable with an industrial feasibility.

DISCLOSURE OF THE INVENTION

An object of the present invention is to provide a palladium-base electroless plating solution which is usable for practical applications even on an industrial scale.

Another object of the invention is to provide a palladium-base electroless plating solution which is high in stability and which gives a deposit of good appearance.

An additional object of the invention is to provide a palladium-base electroless plating solution which produces a deposit having a low porosity, high corrosion resistance and good adherence to the substrate.

A further object of the invention is to provide a palladium-base electroless plating solution which is excellent in workability and which is easy to control.

A still further object of the invention is to provide a palladium-base electroless plating solution which forms a deposit with no or few cracks and having a good solderability.

Still another object of the invention is to provide a palladium-base electroless plating solution which can form a Pd-Ni alloy deposit having surface characteristics unlikely to reduce even in an atmosphere of organic gas.

Other features of the present invention will become apparent from the following description.

The invention provides the following palladium-base electroless plating solutions:

(1) a palladium-base electroless plating solution characterized by being an aqueous solution containing
   (a) 0.0001 to 0.5 mole/l of a palladium compound,
   (b) 0.001 to 8 moles/l of at least one compound of ammonia and amine compounds,
   (c) 1 to 500 mg/l of an organic compound containing bivalent sulfur, and
   (d) 0.005 to 1 mole/l of at least one compound of hypophosphorous acid compounds and boron hydride compounds, and (2) a palladium-base electroless plating solution characterized by being an aqueous solution containing
   (a) 0.0001 to 0.5 mole/l of a palladium compound,
   (b) 0.001 to 1 mole/l of a nickel compound,
   (c) 0.001 to 8 moles/l of at least one compound of ammonia and amine compounds,
   (d) 1 to 500 mg/l of an organic compound containing bivalent sulfur, and
   (e) 0.005 to 1 mole/l of at least one compound of hypophosphorous acid compounds and boron hydride compounds.

The palladium-base electroless plating solutions of the present invention are entirely novel plating solutions containing as a stabilizing agent a combination of at least one compound selected from ammonia and amine compounds with an organic compound containing bivalent sulfur.

Such palladium-base electroless plating solutions are extremely high in stability and can produce a deposit excellent both in the appearance and in the properties. Especially the palladium-base electroless plating solutions containing said stabilizing agent and as a source of metal both a palladium compound and a nickel compound are able to give Pd-Ni alloy deposits satisfactory in the appearance and the properties and are highly stable.

Usable as a source of Pd in the palladium-base electroless plating solution of the invention are palladium compounds such as palladium chloride, palladium sodium chloride, palladium potassium chloride, palladium ammonium chloride, palladium sulfate, palladium nitrate, palladium acetate, palladium oxide and the like. The concentration of palladium compound used is about 0.001 to about 0.5 mole/l, preferably about 0.001 to about 0.1 mole/l. The compound used in a concetration of less than 0.0001 mole/l results in decrease of deposition rate of coating, hence unsuitable for use. On the other hand, the compound used in a concentration of more than 0.5 mole/l does not increase the deposition rate of coating and, what is worse, impairs the stability of the plating solution, hence undesirable.

For the plating solution of the invention to retain its stability, combined use is required of an organic compound containing bivalent sulfur and at least one compound selected from ammonia and amine compounds. The ammonia and amine compound form a complex with the Pd in the plating solution, acting to stably maintain the component in the solution so that they contribute to stabilization of the solution. The concentration of ammonia and/or amine compound is about 0.001 to about 8 moles/l, preferably about 0.01 to about 5 moles/l. When ammonia is used singly, preferred concentration thereof is about 0.075 mole/l or more to enhance the stability of the plating solution. With an increase in the concentration of ammonia and/or amine compound, the stability of the plating solution is the more improved. However, use of ammonia and amine compound in a concentration above said range is uneconomical. Particularly use of ammonia in such concentration is undesirable because its use impairs the work environment due to the odor or the like. The concentration of ammonia and/or amine compound below said range diminishes the stability of the plating solution, rendering the plating solution readily decomposable, hence undesirable.

The term "amine compound" used herein is intended to include amino acids. Examples of amine compounds suitable for use in the present invention are monoamines such as methylamine, ethylamine, propylamine, dimethylamine, trimethylamine, dimethylethylamine, benzylamine, 2-naphthylamine, isobutylamine, isoamylamine and the like, diamines such as methylenediamine, ethylenediamine, tetramethylenediamine, pentamethylenediamine, hexamethylenediamine and the like, polyamines such as diethylenetriamine, tetraethylenepentamine, pentaethylenehexamine, hexaethyleneheptamine and the like, amino acids such as ethylenediaminetetraacetic acid or sodium salt thereof, N-hydroxyethylenediainetriacetic acid or sodium salt thereof, glycine, N-methylglycine, dimethyglycine, iminodiacetic acid, hydantoic acid, glycocyamine and the like, imidazolines such as imidazoline, 2-methyl-2-imidazoline, 2-phenyl-2-imidazoline, 2-benzyl-2-imidazoline, 1,2-diphenyl-2-imidazoline, 2,4,5-triphenyl-2-imidazoline, 2,2'-bis(2-imidazoline), 2-chloromethyl-2-imidazoline and the like, etc.

Preferably usable as at least one compound of ammonia and amine compounds in the present invention are compounds selected from ammonia, diamines and polyamines. More preferably usable are compounds selected from ammonia, ethylenediamine and diethylenetriamine.

In the present invention, at least one compound of the above amine compounds and ammonia is used. When ammonia is used singly, it may take a prolonged period of time until initial occurrence of deposition of metal, namely until beginning of deposition after immersion of substrate in a plating solution. In such case, the conjoint use of ammonia and said amine compound can shorten the period of time until initial occurrence of deposition. The amount of amine compound used conjointly with ammonia is about 0.0005 mole/l or more which is effective in shortening the period of time until initial occurrence of deposition. In deposition of thick coating, the plating solution containing an amime compound is able to deposit a coating of especially good appearance.

Examples of organic compounds containing bivalent sulfur which are suitable for use in the invention are mercaptans such as

$(CH_3)_3CSH$, $CH_3(CH_2)_6CH(CH_3)SH$, $CH_3(CH_2)_{11}SH$, $HSCH_2COOH$, $HSCH_2CH_2COOH$, and the like; sulfides such as $(C_2H_5)_2S$, $(iso-C_3H_7)_2S$, $C_6H_5-S-C_6H_5$, $CH_3-S-C_6H_5$, $HOOCCH_2SCH_2COOH$, $HOOCCH_2CH_2SCH_2CH_2COOH$ and the like; disulfides such as $(CH_3)_2S_2$, $(C_2H_5)_2S_2$, $(C_3H_7)_2S_2$, $C_6H_5-S_2-C_6H_5$, and the like;

thiazoles such as etc. Among these examples, sulfides and disulfides are preferred. These sulfur-containing organic compounds are usable singly or can be used in suitable mixture. The amount of sulfur-containing orgaic compound used is about 1 to about 500 mg/l, preferably about 5 to about 100 mg/l. The amount of sulfur-containing organic compound exceeding said range is undesirable because it decreases the deposition rate and gives a deteriorated appearance to the deposit. Use of the organic compound in a concentration below said range makes the plating solution insufficient in the stability, hence inadequate.

For the plating solution of the present invention, it is critical to use ammonia and/or amine compound conjointly with sulfur-containing organic compound, and the plating solution of the invention is a highly stable one suitable for use on an industrial scale.

In the plating solution of the present invention, at least one compound of hypophosphorous acid compounds and boron hydride compounds is used as a reducing agent for reducing the metal ions. Usable as hypophosphorous acid compounds are hypophosphorous acid, ammonium, lithium, sodium, potassium and calcium salts thereof and the like. Exemplary of useful boron hydride compounds are dimethylaminoborane, trimethylaminoborane, isopropylaminoborane, morpholineborane and like aminoboranes, sodium boron hydride, potassium boron hydride and the like. The amount of reducing agent used is about 0.005 to about 1 mole/l, preferably about 0.01 to about 0.5 mole/l. Use of less than 0.005 mole/l of reducing agent is undesirable because it induces insufficient deposition, whereas use of more than 1 mole/l thereof tends to render the plating solution instable, hence undesirable.

The plating solution of the present invention has a remarkable stability which is attributable to the conjoint use of ammonia and specific sulfur-containing organic compound as described above. In consequence, various kinds of reducing agents can be used as mentioned above.

The palladium-base electroless plating solution of the present invention is an aqueous one prepared by dissolving in water the foregoing effective components: (a) a palladium compound, (b) at least one compound of ammonia and amine compounds, (c) an organic compound containing bivalent sulfur and (d) at least one compound of hypophosphorous acid compounds and boron hydride compounds (hereinafter referred to as "Pd plating solution"). The Pd plating solution of the invention has a good stability and can deposit a Pd coating outstanding in both the appearance and properties.

According to the present invention, the addition of a nickel compound to this plating solution gives a palladium-base electroless plating solution capable of forming a palladium-nickel alloy deposit (hereinafter referred to as "Pd-Ni plating solution"). Such electroless plating solution containing a nickel compound (Pd-Ni plating solution) has a high stability like the above-mentioned Pd plating solution. Further the Pd-Ni alloy deposits formed are outstanding in the appearance and properties like the Pd deposits produced from the Pd plating solution.

Examples of nickel compounds suitable for use in peparing the Pd-Ni plating solution of the invention are nickel chloride, ammonium nickel chloride, nickel bromide, nickel iodide, nickel sulfate, ammonium nickel sulfate, nickel nitrate, nickel carbonate, nickel sulfamate, nickel acetate, nickel benzoate, nickel citrate, nickel formate, nickel tartrate, nickel oxalate, etc. The concentration of nickel compound used is about 0.001 to about 1 mole/l, preferably about 0.01 to about 0.5 mole/l. The concentration of less than 0.001 mole/l of nickel compound makes it difficult to deposit the nickel whereas the concentration of more than 1 mole/l thereof lowers the stability of the plating solution and necessitates the addition of large amount of ammonia and/or amine compound to dissolve the nickel compound, hence uneconomical. Particularly the use of ammonia in such case deteriorates the work environment due to the odor or the like, hence undesirable.

The kinds and amounts of the components other than the nickel compound in the Pd-Ni plating solution may be the same as in the Pd plating solution.

The palladium-nickel ratio in the Pd-Ni alloy deposit formed from the Pd-Ni plating solution can be controlled by varying the concentration ratio of palladium compound to nickel compound in the Pd-Ni plating solution so that a deposit having the desired composition can be easily obtained.

The palladium-base electroless plating solutions of the present invention are prepared by dissolving the above-mentioned effective components in water to form an aqueous solution. While the pH adjustment of said plating solutions is not critical, it is preferred to adjust the pH of Pd plating solution to about 5 to about 10 and the pH of Pd-Ni plating solution to about 5 to about 11. Use of the plating solutions with the pH so adjusted enables the formation of deposits substantially free of cracks. The deposits obtained with little or no crack have a good wettability of solder and a high solderability. The pH adjustment of plating solution may be performed using, for example, HCl, H$_2$SO$_4$ or like acids, or NaOH or like alkali compounds.

The plating solutions of the present invention (i.e. Pd plating solution and Pd-Ni plating solution) can form deposits at a wide temperature rang of about 10° to about 90° C. and can provide, particularly at about 25° to about 70° C., a smooth-surfaced, glossy, optimum deposit. With such property of depositing at relatively low temperatures, the plating solutions of the invention are easy to control and, when containing ammonia, are able to inhibit the volatilization of ammonia, keeping the work environment in fovarable conditions. With the rise in the solution temperature, the plating solutions of the invention tend to form deposits at an increased deposition rate so that the desired deposition rate can be attained by employing a proper temperature within the above temperature range.

The deposition rate achievable by the plating solutions of the present invention depends on the concentration(s) of metal component(s) as well as the solution temperature, but is scarcely affected by the variations in concentrations of other components and in the pH of the plating solution. Accordingly the thickness of deposits formed from the plating solution of the invention can be easily controlled by adjusting the metal concentration and the solution temperature.

For plating treatment with the plating solution of the invention, a substrate having an ability to catalyze the reductive deposition of Pd or Pd-Ni coating is immersed in the plating solution within said temperature range. Examples of useful catalytic substrates are those of made of Fe, Co, Ni, Cu, Sn, Ag, Au, Pt, Pd, alloys thereof or the like. Even non-catalytic substrates such as those of resins, glass, ceramics, W or the like can be plated by immersion in the plating solution of the invention after having been made catalytic by the conventional process such as the senitizing-activating process, catalyser-accelerator process or the like.

The deposition of palladium or palladium-nickel alloy containing from the plating solutions of the invention autocatalytically proceeds, resulting therefore in deposits having a low porosity and, moreover, a high adherence to the substrate.

The palladium-base electroless plating solutions of the present invention have the following excellent characteristics.

(1) The plating solutions of the present invention are remarkable in the stability.

(2) The deposits formed from the plating solutions of the invention have a good appearance and, even when having a great thickness, a satisfactory one.

(3) The plating solutions of the invention achieve an autocatalytic deposition and thus give a deposit with a low porosity, high corrosion resistance and good adherence to the substrate.

(4) The plating solutions of the invention are so stable that those containing a small amount of ammonia are usable, which makes possible the inhibition of volatilization of ammonia. Further the plating solutions of the invention containing an amine compound does not volatilize the amine compound during plating operation and in storage. Consequently the plating solutions of the invention are stable in the storage and the work environment is kept in good conditions.

(5) The plating solutions of the invention can form deposits at a low temperature and thus has a good workability. When used as an ammonia bath, the plating solutions of the invention volatilizes little amount of ammonia and are easy to control.

(6) The deposition rate depends only on the metal concentration and solution temperature and is scarcely influenced by the concentrations of the other components and the pH of the plating solution. Therefore, the thickness of deposit is easy to control.

(7) By adjusting the pH of plating solution to an approximate neutrality, it becomes possible to use a wider range of substrates to be treated, more varied kinds of resist inks and plating equipment made of various kinds of materials.

(8) Deposits having little or no crack can be obtained by adjusting the Pd plating solution to a pH of 5 to 10 or the Pd-Ni plating solution to a pH of 5 to 11. These deposits have a good solderability and are suited to applications to electronic parts.

(9) From the Pd-Ni plating solution, a Pd-Ni alloy deposit of the desired composition according to a particular application can be easily formed by varying the Pd-Ni ratio in the solution. Further the resulting Pd-Ni alloy deposit even in an atmosphere of organic gas produces no polymer on the deposit surface and is optimal in application to electric contact portions in which reliability is required.

The plating baths of the invention are palladium-base electroless plating solutions having excellent characteristics as stated above and are extremely useful in applications, e.g., application to contact portions, which require a high reliability, of electronic parts and application to undercoats for extending the life of gold deposit. Particularly the plating baths of the invention are extensively usable for parts requiring a corrosion resistance and the like.

BEST EMBODIMENTS FOR PRACTICING THE INVENTION

The present invention will be described below in greater detail with reference to the following Examples.

EXAMPLE 1

A plating solution of the following composition was prepared.

| | |
|---|---|
| $PdCl_2$ | 0.01 mole/l |
| Ammonia (28%) | 200 ml/l |
| | (3.0 mole/l) |
| Disodium ethylenediamine tetraacetate (EDTA.2Na) | 0.01 mole/l |
| Thiodiglycollic acid | 20 mg/l |
| $NaH_2PO_2$ | 0.08 mole/l |

Figure 1:
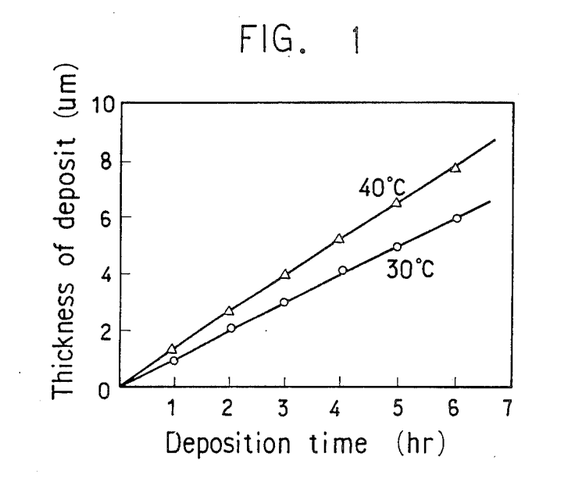
FIG. 1 is a graph showing the relationship between the deposition time in a Pd plating solution and the thickness of deposit.

Two deposits were formed on copper plates from the foregoing plating solution at solution temperatures of 30° C. and 40° C., respectively. FIG. 1 shows a graph of the relationship between the deposit thickness and the deposition time.

As seen from FIG. 1, the deposition rate was 1.0 μm/hr at a solution temperature of 30° C. and 1.3 μm/hr at a solution temperature of 40° C., and the deposit thickness linearly increased with time. This reveals that the deposition autocatalytically proceeded and that the stability of deposition rate was remarkable.

The deposits thus obtained were subjected to bending test and were found to have a high adherence to the substrate. A thick deposit produced by 6 hours of deposition showed a good appearance glossy in silver white.

Portions of the above plating solution were each heated to 90° C., and subjected to closed storage at 25° C. and to open storage at 25° C., repsectively to investigate the stabilities of the plating solution with the results shown below in Table 1. For comparison, the conventional baths having the compositions shown below were tested for stabilities in the same manner.

| Conventional bath (1) | |
| --- | --- |
| PdCl$_2$ | 5.4 g/l |
| Ammonia | 350 g/l |
| EDTA.2Na | 34 g/l |
| Hydrazine | 0.3 g/l |
| Conventional bath (2) | |
| PdCl$_2$ | 10.0 g/l |
| EDTA.2Na | 19.0 g/l |
| Ethylenediamine | 25.6 g/l |
| NaH$_2$PO$_2$ | 4.1 g/l |

TABLE 1

| | Heating to 90° C. | Closed storage at 25° C. | Open storage at 25° C. |
| --- | --- | --- | --- |
| Plating solution of the invention | Not decomposed | Not decomposed after 4-month storage | Decomposed in 7 days |
| Conventional bath (1) | Decomposed within 5 minutes | Decomposed in a week | Decomposed within 1 day |
| Conventional bath (2) | Decomposed within 5 minutes | Decomposed in 2 weeks | Decomposed within 1 day |

The results in Table 1 show that the plating solution of the present invention is remarkable in stabilities.

EXAMPLE 2

The plating solution of the present invention described in Example 1 was adjusted to the pH values listed in Table 2 below (using HCl) and deposits of 1 μm thickness were formed on copper plates form the solution at a solution temperature of 40° C. The plating solution with the pH unadjusted was 11.5 in pH. The deposits obtained were observed under a scanning electron microscope (3000×) to check the state of the deposits and were tested for solderability by the following method. The results are shown below in Table 2. Test for solderability:

The sample with the deposit formed thereon (25 mm×25 mm×0.3 mm) was immersed in a rosin flux (25% solution of rosin in isopropyl alcohol) for pretreatment. Using a Meniscograph (product of Philips Co.), the sample was dippsed into a 6/4 solder melt (tin:lead=6:4, melted to 230°C.) to a depth of 12 mm at an angle vertical to the surface of the melt. The time taken until the contact angle between the solder melt and the sample surface 90° was determined as zero cross time (according to MILL STD-883B). The shorter the zero cross time is, the higher the wettability of solder melt over the deposit can be said. Thereafter the sample was observed to check the state of solder adhered thereto for evaluation of the adhesion of solder to the sample. The results were indicated by the following symbols.
A. The solder uniformly adhered.
B. The solder adhered to 98% or more of immersed portion of sample surface although partly irregularly.
C. The solder irregularly adhered to less than 98% of immersed portion of sample surface.

TABLE 2

| | pH | State of deposit | Solderability Zero cross time | Solderability Appearance after solder adhered | Deposition rate (μm/hr) |
| --- | --- | --- | --- | --- | --- |
| Bath of present invention | 11.5 | Cracks formed | Over 5 sec | C | 1.3 |
| | 10 | Small cracks formed | 4.2 sec | B | 1.2 |
| | 9 | No crack formed | 3.0 sec | A | 1.2 |
| | 8 | No crack formed | 2.8 sec | A | 1.2 |
| | 7 | No crack formed | 2.9 sec | A | 1.1 |
| Conventional bath (1) | — | Cracks formed | Over 5 sec | C | 0.5 |
| Conventional bath (2) | — | Cracks formed | Over 5 sec | C | 0.6 |

EXAMPLE 3

Deposits were formed on copper plates in the same manner as in Example 1 by immersing the copper plates in the same plating baths as used in Example 1 with the exception of using EDTA.2Na in amounts varied as shown below in Table 3. The time taken from immersion of the plate in the bath until beginning of deposition of palladium, i.e., time until initial occurrence, was determined. The results are shown below in Table 3.

TABLE 3

| | Time until initial occurrence (min) | | | |
| --- | --- | --- | --- | --- |
| EDTA.2Na (mole/l) | 0 | 0.005 | 0.010 | 0.015 |
| Solution temp./30° C. | 35 | 4.3 | 4.5 | 4.8 |
| Solution temp./40° C. | 10 | 1.5 | 2.5 | 3.0 |

Table 3 shows that when ammonia and EDTA.2Na are conjointly used, the time until initial occurrence is significantly shortened. When the plating solution contained not less than 0.005 mole/l of EDTA.2Na, the deposit thickly formed exhibited a remarkably good appearance.

EXAMPLE 4

A plating solution having the following composition was prepared.

| PdCl$_2$ | 0.01 mole/l |
| --- | --- |
| NH$_2$CH$_2$CH$_2$NH$_2$ | 0.08 mole/l |
| Thiodiglycollic acid | 20 mg/l |
| NaH$_2$PO$_2$.H$_2$O | 0.06 mole/l |

A deposit was formed on a copper plate from this plating solution at a solution temperature of 60° C. The pH of the plating solution was 11.0. The deposition rate was 1.41 μm/hr. A linear relationship was recognized between the amount of deposition and the deposition time from which it was confirmed that autocatalytic deposition occurred. Deposition was continued for 6 hours to give a thick deposit which was found to have a good appearance. This sample was subjected to bending test according to JIS-Z-2248 and showed a good adhesion to the substrate without any abnormal change.

The above-mentioned plating solution caused no decomposition even when heated to 90° C. and also when subjected to open storage at 25° C. for 4 months.

EXAMPLE 5

The plating solution described in Example 4 was adjusted to the pH values shown below in Table 4 with HCl. Deposits of 1 μm thickness were formed to copper plates from the solution at a solution temperature of 60° C. The deposits thus obtained were observed to check the appearance of deposits and tested for solderability in the same manner as in Example 2. The results are shown below in Table 4.

TABLE 4

| | | Solderability | | |
|---|---|---|---|---|
| pH | State of deposit | Zero cross time | Appearance after solder adhered | Deposition rate (μm/hr) |
| 11 | Cracks formed | Over 5 sec | C | 1.41 |
| 10 | Small crack formed | 4.3 sec | B | 1.41 |
| 9 | No crack formed | 3.8 sec | A | 1.40 |
| 8 | " | 3.6 sec | A | 1.41 |
| 7 | " | 3.4 sec | A | 1.39 |
| 5 | " | 3.6 sec | A | 1.39 |

EXAMPLE 6

Plating solutions with the following composition was prepared.

| | |
|---|---|
| PdCl$_2$ | 0.01 mole/l |
| Amine compound* | 0.08 mole/l |
| Thiodiglycollic acid | 20 mg/l |
| NaH$_2$PO$_2$.H$_2$O | 0.06 mole/l |

These plating solutions were adjusted to a pH of 8 with hydrochloric acid and deposits were formed on copper plates from the solutions at a solution temperature of 60° C. The deposits thus produced were good both in the adhesion to the substrate and in the appearance. Further the deposits formed no crack and had a high solderability. The plating solutions were further checked for heat stability and for storage stability and exhibited excellent stabilities.

EXAMPLE 7

Plating solutions with the following composition were prepared.

| | |
|---|---|
| PdCl$_2$ | 0.01 mole/l |
| NH$_2$CH$_2$CH$_2$NH$_2$ | 0.08 mole/l |
| Sulfur-containing organic compound* | 20 mg/l |
| NaH$_2$PO$_2$.H$_2$O | 0.06 mole/l |

*Used as the sulfur-containing organic compound were HSCH$_2$COOH,

, HOOCCH$_2$CH$_2$SCH$_2$CH$_2$COOH, (CH$_3$)$_2$S$_2$, and which were each used singly.

These plating solutions were adjusted to a pH of 8 with hydrochloric acid and applied to copper plates at a solution temperature of 60° C. The deposits thus formed were outstanding both in the adhesion to the substrate and in the appearance. In addition, the deposits created no crack and had a good solderability. The plating solutions were further checked for heat stability and for storage stability and showed excellent stabilities.

EXAMPLE 8

Plating solutions with the following composition were prepared.

| | |
|---|---|
| PdCl$_2$ | 0.01 mole/l |
| NH$_2$CH$_2$CH$_2$NH$_2$ | 0.08 mole/l |
| Thiodiglycollic acid | 20 mg/l |
| Reducing agent* | 0.06 mole/l |

*Used as the reducing agent were dimethylaminborane, isopropylaminoborane, morpholineborane and sodium boron hydride, which were each used singly.

These plating solutions were adjusted to a pH of 8 with hydrochloric acid and applied to copper plates at a solution temperature of 60° C. The deposits thus obtained were excellent both in the adhesion to the substrate and in the appearance. The deposits were free of cracks and good in solderability. The plating solutions were further checked for heat stability and for storage stability and showed satisfactory stabilities.

EXAMPLE 9

Plating solutions with the following composition were prepared.

| | |
|---|---|
| PdCl$_2$ | 0.01 mole/l |
| NiCl$_2$.6H$_2$O | Amount varied as shown below |
| 28% Ammonia water | 200 ml/l |
| Thiodiglycollic acid | 20 mg/l |
| NaH$_2$PO$_2$.H$_2$O | 0.08 mole/l |

*NiCl$_2$.6H$_2$O was used in six different amounts of 0.005, 0.01, 0.02, 0.05, 0.1 and 0.2 mole, respectively per liter.

Figure 2:
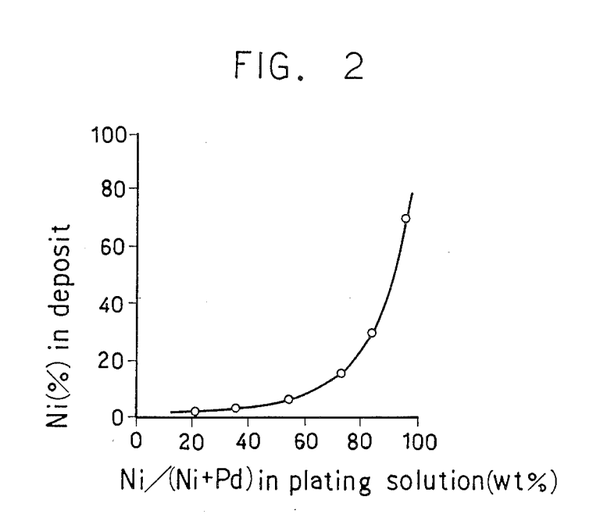
FIG. 2 is a graph showing the relationship between the Pd-Ni ratio in a Pd-Ni plating solution and the Ni amount of deposit.

The plating solutions obtained were applied to copper plates at a solution temperature of 40° C. over a period of 1 hour. FIG. 2 shows the relationship between the Ni/Pd ratio in the plating solution and the Ni amount in the deposit. As apparent from FIG. 2, it was seen that a deposit of the desired composition can be formed by adjusting the Ni/Pd ratio in the plating solution. The deposits thus obtained were excellent in the appearance. The deposits were subjected to bending test according to JIS-Z-2248 and all showed a good adhesion to the substrate without any abnormality.

Table 5 below shows the results obtained by heating the plating solutions to 90° C. and subjecting them to closed storage at 25° C. and to open storage at 25° C. respectively in separate tests to check the stabilities of the plating solutions.

TABLE 5

| NiCl$_2$.6H$_2$O (mole/l) | Heating to 90° C. | Closed storage at 25° C. | Open storage at 25° C. |
|---|---|---|---|
| 0.005 | Not decomposed | Not decomposed after 4-month storage | Decomposed in 7 days |
| 0.01 | Not decomposed | Not decomposed after 4-month storage | Decomposed in 7 days |
| 0.02 | Not decomposed | Not decomposed after 4-month storage | Decomposed in 7 days |
| 0.05 | Not decomposed | Not decomposed after 4-month storage | Decomposed in 7 days |
| 0.1 | Not decomposed | Not decomposed after 4-month storage | Decomposed in 5 days |

TABLE 5-continued

| NiCl$_2$.6H$_2$O (mole/l) | Heating to 90° C. | Closed storage at 25° C. | Open storage at 25° C. |
| --- | --- | --- | --- |
| 0.2 | Not decomposed | Not decomposed after 4-month storage | Decomposed in 4 days |

For comparison, a plating solution having the same composition as above with the exception of not containing a thiodiglycollic acid(containing 0.1 mole/l of NiCl$_2$.6H$_2$O) was tested for storage stability and decomposed in about 1 hour when stored at 25° C. and decomposed within 5 minutes when stored at 40° C.

The foregoing results show that the plating solution of the present invention is excellent in stabilities at high temperatures and in long-term storage stability at room temperature. Incidentally the open storage caused the decomposition of plating solution in 4 to 7 days which are, however, remarkable as compared with the results obtained in respect of conventional plating solutions. The decomposition of plating solution induced by open storage is attributable to the volatilization of ammonia. Replenishment of ammonia in a suitable amount enables the long-term open storage.

EXAMPLE 10

Plating solutions with the following composition were prepared.

| | |
| --- | --- |
| PdCl$_2$ | 0.01 mole/l |
| NiCl$_2$.6H$_2$O | 0.1 mole/l |
| 28% Ammonia water | 200 ml/l |
| Thiodiglycollic acid | 20 mg/l |
| NaH$_2$PO$_2$.H$_2$O or NaBH$_4$ | 0.08 mole/l |

Figure 3:
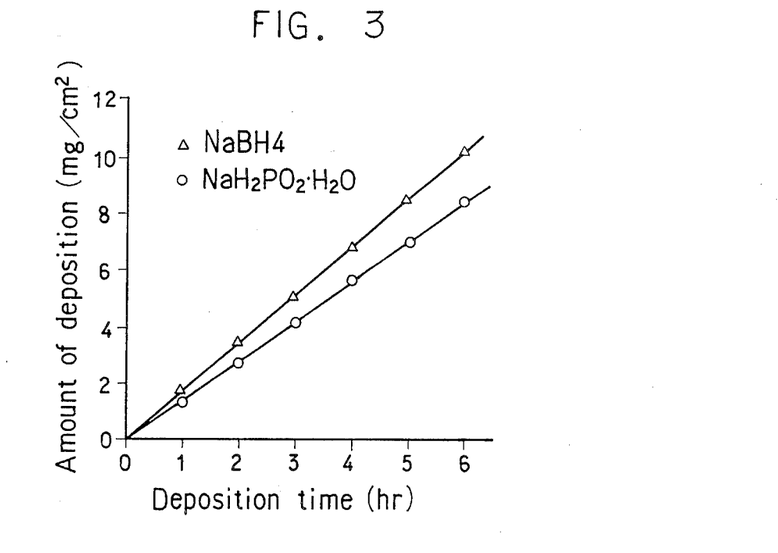
FIG. 3 is a graph showing the relationship between the deposition time in a Pd-Ni plating solution and the amount of deposition.

FIG. 3 shows the relationship between the deposition time and the amount of deposition when this plating solution was applied to a copper plate at a solution temperature of 40° C. In FIG. 3, the mark O shows the result obtained when using NaH$_2$PO$_2$.H$_2$O and the mark Δ the result obtained when using NaBH$_4$. FIG. 3 reveals that when NaH$_2$PO$_2$.H$_2$O was used, the deposition rate was 1.4 mg/cm$^2$.hr and that when NaBH$_4$ was used, the deposition rate was 1.7 mg/cm$^2$.hr. In either case, a linear relationship is recognized between the deposition time and the amount of deposition which shows the occurrence of autocatalytic deposition. The Ni amount in the deposit was about 30% by weight in use of NaH$_2$PO$_4$.H$_2$O and about 35% by weight in use of NaBH$_4$.

EXAMPLE 11

Plating solutions with the following composition were prepared.

| | |
| --- | --- |
| PdCl$_2$ | 0.01 mole/l |
| NiCl$_2$.6H$_2$O | 0.1 mole/l |
| 28% Ammonia water | 200 ml/l |
| Sulfur-containing organic compound* | 20 mg/l |
| NaH$_2$PO$_2$.H$_2$O | 0.08 mole/l |

*Used as the sulfur-containing organic compound were three kinds of such compounds, i.e. thiodiglycollic acid, thiodipropionic acid and 2-mercaptobenzothiazole.

Figure 4:
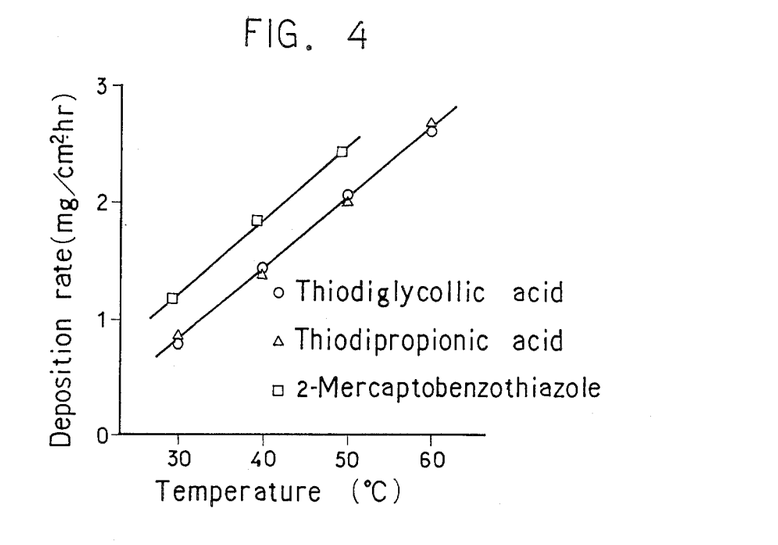
FIG. 4 is a graph showing the relationship between the solution temperatue in a Pd-Ni plating solution and the deposition rate.
Figure 5:
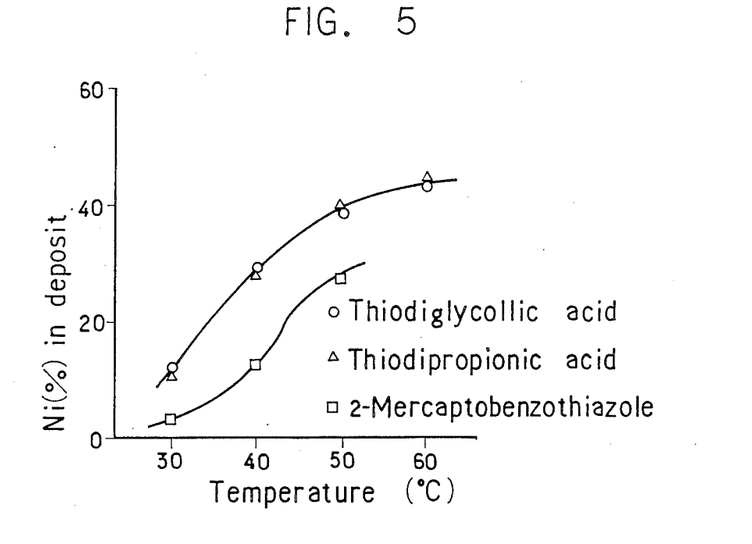
FIG. 5 is a graph showing a relationship between the solution temperature in a Pd-Ni plating solution and the Ni amount of deposit.

FIG. 4 shows the relationship between the solution temperature and the deposition rate when these plating solutions were applied to copper plates at varied solution temperatures over a period of 1 hour. FIG. 5 indicates the relationship between the solution temperature and the Ni amount in the deposit. In these drawings, the mark O shows the result obtained in use of thiodiglycollic acid, the mark Δ the result in use of thiodipropionic acid and the mark □ the result in use of 2-mercaptobenzothiazole. The results reveal that with the rise of solution temperature, the deposition rate tends to increase and the Ni amount in the deposit is likely to increase. The deposits obtained presented a good appearance when any of thiodiglycollic acid, thiodipropionic acid and 2-mercaptobenzothiazole is used.

EXAMPLE 12

A plating solution with the following composition was prepared.

| | |
| --- | --- |
| PdCl$_2$ | 0.01 mole/l |
| NiCl$_2$.6H$_2$O | 0.1 mole/l |
| NH$_2$CH$_2$CH$_2$NH$_2$ | 0.08 mole/l |
| Thiodiglycollic acid | 20 mg/l |
| NaH$_2$PO$_2$.H$_2$O | 0.08 mole/l |

This plating solution was applied to a copper plate at a solution temperature of 40° C. over a period of 1 hour. The resulting deposit contained about 30% by weight of Ni and was excellent both in the appearance and in the adhesion to the substrate. The plating solution did not decompose even by being heated to 90° C. or by open storage at 25° C. for 4 months.

EXAMPLE 13

The plating solution as described in Example 12 was adjusted to the pH values shown below in Table 6 with HCl and NaOH, and applied to copper plates at a solution temperature of 40° C. to form deposits having a thickness of 1 μm. The deposits thus obtained were evaluated in terms of the state of deposits and tested for solderability, and the deposition rate was determined. The results are shown in Table 6.

TABLE 6

| | | Solderability | | |
| --- | --- | --- | --- | --- |
| pH | State of deposit | Zero cross time | Appearance after solder adhered | Deposition rate (mg/cm$^2$-hr) |
| 12 | Small cracks formed | 4.8 sec | B | 1.42 |
| 11 | No crack formed | 3.6 sec | A | 1.40 |
| 10 | " | 3.3 sec | A | 1.41 |
| 9 | " | 3.2 sec | A | 1.42 |
| 8 | " | 3.4 sec | A | 1.40 |
| 7 | " | 3.4 sec | A | 1.38 |
| 5 | " | 3.2 sec | A | 1.38 |

EXAMPLE 14

Plating solutions with the following composition were prepared.

| | |
| --- | --- |
| PdCl$_2$ | 0.01 mole/l |
| NiCl$_2$.6H$_2$O | 0.1 mole/l |
| Amine compound* | 0.08 mole/l |
| Thiodiglycollic acid | 20 mg/l |
| NaH$_2$PO$_2$.H$_2$O | 0.06 mole/l |

*Used as the amine compound were dimethylamine, dimethylethylamine, methylenediamine, tetramethylenediamine, diethylenetriamine, pentaethylenehexamine, N—hydroxyethylenediaminetriacetic acid, glycine, imidazoline and 2-benzyl-2-imidazoline, which were each used singly.

These plating solutions were adjusted to a pH of 8 with hydrochloric acid and applied to copper plates at a solution temperature of 60° C. The deposits thus produced were good in the adhesion to the substrate and in the appearance. The deposits formed no crack and had a high solderability. The plating solutions were further checked for heat stability and for storage stability and exhibited excellent stabilities.

EXAMPLE 15

Plating solutions with the following composition were prepared.

| | |
|---|---|
| PdCl$_2$ | 0.01 mole/l |
| NiCl$_2$.6H$_2$O | 0.1 mole/l |
| NH$_2$CH$_2$CH$_2$NH$_2$ | 0.08 mole/l |
| Sulfur-containing organic compound* | 20 mg/l |
| NaH$_2$PO$_2$.H$_2$O | 0.06 mole/l |

*Used as the sulfur-containing organic compound were HSCH$_2$COOH,

, HOOCCH$_2$CH$_2$SCH$_2$CH$_2$COOH, (CH$_3$)$_2$S$_2$, and which were each used singly.

These plating solutions were adjusted to a pH of 8 with hydrochloric acid and applied to copper plates at a solution temperature of 60° C. The deposits thus formed were outstanding both in the adhesion to the substrate and in the appearance. In addition, the deposits produced no crack and had a good solderability. The plating solutions were further checked for heat stability and for storage stability and exhibited satisfactory stabilities.

EXAMPLE 16

Plating solutions with the following composition were prepared.

| | |
|---|---|
| PdCl$_2$ | 0.01 mole/l |
| NiCl$_2$.6H$_2$O | 0.1 mole/l |
| NH$_2$CH$_2$CH$_2$NH$_2$ | 0.08 mole/l |
| Thiodiglycollic acid | 20 mg/l |
| Reducing agent* | 0.06 mole/l |

*Used as the reducing agent were dimethylamineborane, isopropylamineborane, morpholineborane and sodium boron hydride, which were each singly used.

These plating solutions were adjusted to a pH of 8 with hydrochloric acid and applied to copper plates at a solution temperature of 60° C. The deposits thus formed were excellent both in the adhesion to the substrate and in the appearance. The deposits were free of cracks and good in solderability. The plating solutions were further checked for heat stability and for storage stability and exhibited satisfactory stabilities.

We claim:

1. A palladium-based electroless plating solution consisting essentially of an aqueous solution of effective components, wherein said effective components consist essentially of the following components in the following concentrations:
    (a) 0.0001 to 0.5 mole/l of a palladium compound,
    (b) 0.001 to 8 moles/l of at least one compound selected from the group consisting of ammonia and amine compounds,
    (c) 1 to 500 mg/l of an organic compound containing bivalent sulfur, and
    (d) 0.005 to 1 mole/l of at least one compound selected from the group consisting of hypophosphorous acid compounds and boron hydride compounds.

2. A palladium-base electroless plating solution according to claim 1 wherein the amine compounds are monoamines, diamines polyamines, amino acids and imidazolines.

3. A palladium-base electroless plating solution according to claim 1 wherein the amine compounds are diamines and polyamines.

4. A palladium-base electroless plating solution according to claim 1 wherein the amine compounds are ethylenediamine and diethylenetriamine.

5. A palladium-base electroless plating solution according to claim 1 wherein the organic compound contaning bivalent sulfur is at least one compound of mercaptans, sulfides, disulfides, thiazoles, 6. A palladium-base electroless plating solution according to claim 1 wherein the organic compound containing bivalent sulfur is at least one compound of sulfides and disulfides.

7. A palladium-base electroless plating solution according to claim 1 which has a pH of about about 5 to about 10.

8. A palladium-based electroless plating solution consisting essentially of an aqueous solution of effective components, wherein said effective components consist essentially of the following components in the following concentrations:
    (a) 0.0001 to 0.5 mole/l of a palladium compound,
    (b) 0.001 to 1 mole/l of a nickel compound,
    (c) 0.001 to 8 moles/l of at least one compound selected from the group consisting of ammonia and amine compounds,
    (d) 1 to 500 mg/l of an organic compound containing bivalent sulfur, and
    (e) 0.005 to 1 mole/l of at least one compound selected from the group consisting of hypophosphorous acid compounds and boron hydride compounds.

9. A palladium-base electroless plating solution according to claim 8 wherein the amine compounds are monoamines, diamines, polyamines, aminio acids and imidazolines.

10. A palladium-base electroless plating solution according to claim 8 wherein the amine compounds are diamines and polyamines.

11. A palladium-base electroless plating solution according to claim 8 where the amine compounds are ethylenediamine and diethylenetriamine.

12. A palladium-base electroless plating solution according to claim 8 wherein the organic compound containing bivalent sulfur is at least one compound of mercaptans, sulfides, disulfides, thiazoles, 13. A palladium-base electroless plating solution according to claim 8 wherein the organic compound containing bivalent sulfur is at least one compound of sulfides and disulfides.

14. A palladium-base electroless plating solution according to claim 8 which has a pH of about 5 to about 11.

* * * * *